(12) United States Patent
Turner et al.

(10) Patent No.: US 7,932,762 B2
(45) Date of Patent: Apr. 26, 2011

(54) LATCH AND DFF DESIGN WITH IMPROVED SOFT ERROR RATE AND A METHOD OF OPERATING A DFF

(75) Inventors: Mark F. Turner, Longmont, CO (US); Jeff S. Brown, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 75 days.

(21) Appl. No.: 12/337,628

(22) Filed: Dec. 18, 2008

(65) Prior Publication Data

US 2010/0156494 A1  Jun. 24, 2010

(51) Int. Cl.
*H03K 3/037* (2006.01)
*H03K 3/3562* (2006.01)

(52) U.S. Cl. ........ 327/225; 327/202; 327/203; 327/208; 327/212; 327/214; 327/218; 326/93; 326/95; 326/98

(58) Field of Classification Search .......... 327/199–203, 327/208–214, 218, 225, 219; 326/93–98; 365/49.11
See application file for complete search history.

(56) References Cited

U.S. PATENT DOCUMENTS 6,198,324 B1 *  3/2001  Schober ........................ 327/202
* cited by examiner

*Primary Examiner* — Lincoln Donovan
*Assistant Examiner* — Patrick O'Neill (57) ABSTRACT

A single-path latch, a dual-path latch, a method of operating a DFF and a library of cells. In one embodiment, the single-path latch includes: (1) a passgate coupled to the data input, (2) a feedback path coupled to the passgate, the data output coupled thereto and (3) tristate circuitry coupled to the passgate and having a single transistor pair of opposite conductivity coupled to Boolean logic gates, the Boolean logic gates configured to control operation of the single transistor pair based on the data input and a pulse clock signal to drive the feedbacks path.

23 Claims, 7 Drawing Sheets

LATCH AND DFF DESIGN WITH IMPROVED SOFT ERROR RATE AND A METHOD OF OPERATING A DFF

TECHNICAL FIELD

The invention is directed, in general, to logic gates for improving a Soft Error Rate (SER) of integrated circuits (ICs) and, more specifically, to a latch and D flip-flop (DFF) that has an enhanced immunity to soft errors.

BACKGROUND

Soft errors involve changes to data (e.g., the electrons in a storage circuit), but do not necessarily indicate changes to a physical circuit. After a soft error has been observed, there is no implication that a circuit or component is unreliable. In other words, if data is rewritten after a soft error, a circuit can still function properly and the error may go unnoticed.

Background radiation from alpha particles, neutrons and cosmic rays can create soft errors in an IC. Momentary upsets (so-called single-event upsets, or SEUs) in data inside an IC may lead to a soft error. Some SEUs, called single-event transients (SETs), do not affect bit values. Other, more severe SEUs may affect the value of one or more bits. SEUs that affect the value of one bit are called SBUs. The rate at which SBUs occur affects the IC's SER. The SER of an IC is the rate at which soft errors occur due to, for example, background radiation.

SBUs may go unnoticed if the data is changed back to the correct value before it is stored. However, an SBU may cause a soft error if the upset data is stored or if the upset directly changes the data contained in a storage element. Modern technology is more susceptible to upsets due to reductions in feature sizes and operating voltages. With such reductions, the SER of standard logic elements in ICs continues to rise. Thus, reducing the SER associated with logic elements has become an important design consideration.

SER for ICs can be reduced at a system level or at an individual gate level. At the system level, products targeted for devices more likely to receive increased background radiation, such as satellites, have been designed to increase SER tolerance by using temporal or special displacement schemes, or by replicating logic and using voting schemes. Different designs have been used which trade off area, power performance and SER, although many of these designs are proprietary. System and architectural solutions to reduce SER require customer interaction which may not be practical (especially if the design is created in a traditional ASIC engagement) and can be expensive in terms of the IC die area required. A voting scheme, for example, may require three times the die size of a traditional design that is not enhanced to address soft errors. Due to additional requirements, conventional solutions to reduce SER are almost exclusively used for space, medical or military markets which can tolerate the high initial device cost to reduce the cost of a failing device.

SUMMARY

One aspect provides a latch having a data input and a data output. In one embodiment, the latch includes: (1) a passgate coupled to the data input, (2) a feedback path coupled to the passgate, the data output coupled thereto and (3) tristate circuitry coupled to the passgate and having a single transistor pair of opposite conductivity coupled to Boolean logic gates, the Boolean logic gates configured to control operation of the single transistor pair based on the data input and a pulse clock signal to drive the feedback path.

Another aspect provides a method of operating a D flip-flop having a data input and a data output. In one embodiment the method includes: (1) receiving a logic state into a master stage via a passgate thereof, the master stage further including master stage tristate circuitry having a single transistor pair of opposite conductivity coupled to master stage Boolean logic gates, (2) passing the logic state from the master stage to a slave stage via a slave stage passgate coupled to the master stage and (3) passing the logic state from the slave stage passgate to the data output via the slave stage having tristate circuitry, the slave stage tristate circuitry having a slave stage single transistor pair of opposite conductivity coupled to slave stage Boolean logic gates.

Yet another aspect provides a D flip-flop having a data input and a data output including a master stage having a master stage passgate coupled to the data input and a slave stage having a slave stage passgate coupled to the master stage. Both of the master stage and the slave stage include: (1) a feedback path and (2) tristate circuitry coupled to the feedback path and having a single transistor pair of opposite conductivity coupled to Boolean logic gates, the Boolean logic gates configured to control operation of the single transistor pair based on the data input and a pulse clock signal to drive the feedback path.

Still a different aspect provides a library of standard logic elements including a standard logic element corresponding to a single-path latch having: (1) a passgate configured to receive a data input, (2) a feedback path coupled to the passgate and an output of the single-path latch and (3) tristate circuitry coupled to the passgate and having a single transistor pair of opposite conductivity coupled to Boolean logic gates, the Boolean logic gates configured to control operation of the single transistor pair based on the data input and a pulse clock signal to drive the feedback path.

BRIEF DESCRIPTION

Reference is now made to the following descriptions taken in conjunction with the accompanying drawings, in which.

DETAILED DESCRIPTION

At the logic element level, SER is inherently dependent on the storage element design. In digital ICs, one standard logic element to store data is a DFF. Another standard logic element is a transparent latch. A basic DFF is built by combining two serial latches. Thus, latches with enhanced immunity to soft errors, can be used to construct DFFs with enhanced immunity to soft errors.

Conventional DFFs may include two latches that are serially coupled. A transmission gate latch has a pair of passgates, also known as transmission gates, that alternately allow the latch to be transparent or latched (in which it stores the value at the end of the last transparent phase). The passgates may be inverter-driven or implemented as tristate buffers, which use series-coupled transistors of opposite conductivity.

Figure 1:
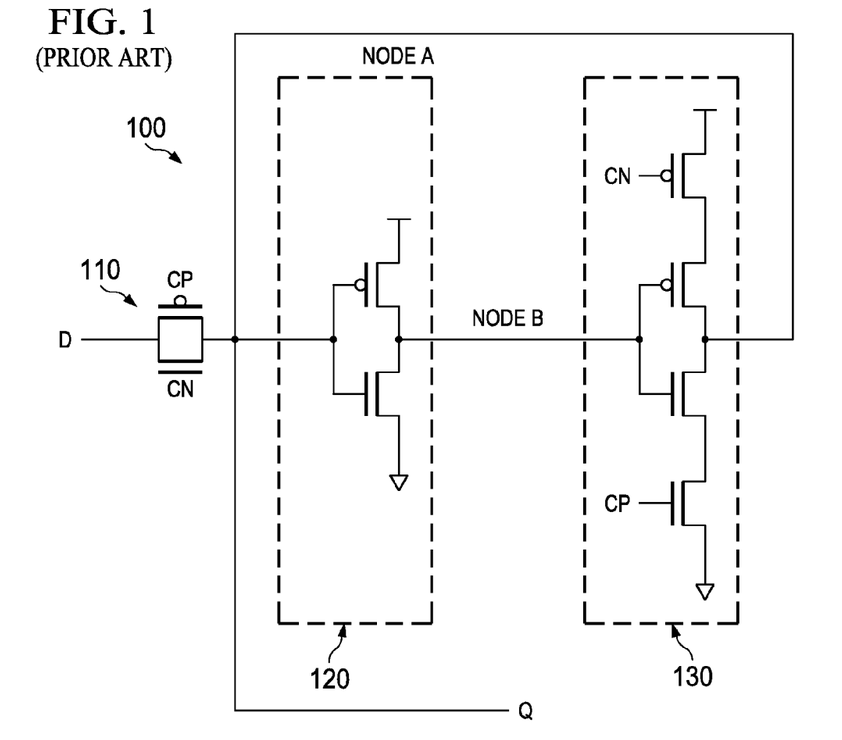
FIG. 1 is a device-level schematic diagram of a conventional latch.

FIG. 1 illustrates a conventional latch 100 including a passgate 110, an inverter 120 and an additional passgate implemented as feedback tristate driver 130. The passgate 110 is coupled to a clock and is configured to alternately allow the latch 100 to be transparent or latched based on a negative clock pulse signal, CN, and a positive clock pulse signal CP. The transparent state is accomplished by having the input D connected to the internals of the latch 100 (e.g., Nodes A and B) by two transistors that make up the passgate 110, whereas the four transistors that make up the feedback tristate driver 130 are tristated so that the internal feedback is disabled.

In the latched state, the latch 100 will store the value of the data that was last passed through the latch 100 while in the last transparent state. In other words, regardless of the value of D, the output Q should be the stored internal value. In the latch 100, this may be accomplished by disconnecting the D input from the internal of the latch (by turning off the passgate 110) and turning on the feedback tristate driver 130 so that the regenerative feedback will hold the internal value.

In the latched state, radiation can upset the stored value of the latch 100 by injecting charge on internal Nodes A and B that can disturb the internal stored value. For example, if a large enough charge is injected onto Node A of the latch 100, then the internal stored value can temporarily be inverted on Node A which will be replicated with the regenerative feedback of the circuit.

Conventional methods of reducing SER include designing a circuit which requires a larger injected charge to flip a stored value. Another conventional method is to reduce the number of susceptible diffusion areas (or reduce size of the diffusion areas) to create less (or smaller) targets for the radiation to effect. The latch 100 uses a traditional stack of 4 transistors to implement the feedback tristate driver 130. By having the transistors connected in series, the drive strength of the transistors is cut in half. The feedback tristate driver 130, therefore, weakly drives the feedback of the latch 100 onto Node A making it more susceptible to disturb (with a smaller charge injected). Furthermore, while in a susceptible state, both of the drains of the off transistors are targets, doubling their target area. If the transistors are made wider to reduce resistance (and increase their drive strength onto Node A), then the transistors become larger targets.

Therefore, disclosed herein are latches configured to reduce the SER associated with ICs. DFFs including the disclosed latches are also disclosed. The latches include tristate circuitry using a single NMOS and PMOS transistor pair coupled with boolean decoded gate controls in the internal feedback loop of the latch. The tristate circuitry may be configured as tristate drivers that are used in tristate bus drivers (and I/O's). Using the tristate circuitry in a latch can reduce the SER by providing an improved feedback drive while using less die area. The boolean decoded gate controls may be simplified to reduce the size of the circuit by eliminating two transistors from the common latch as also disclosed herein. Additionally, another embodiment of a latch mirrors the feedback drive circuitry so that the feedback paths are split for further SER reduction.

Figure 2:
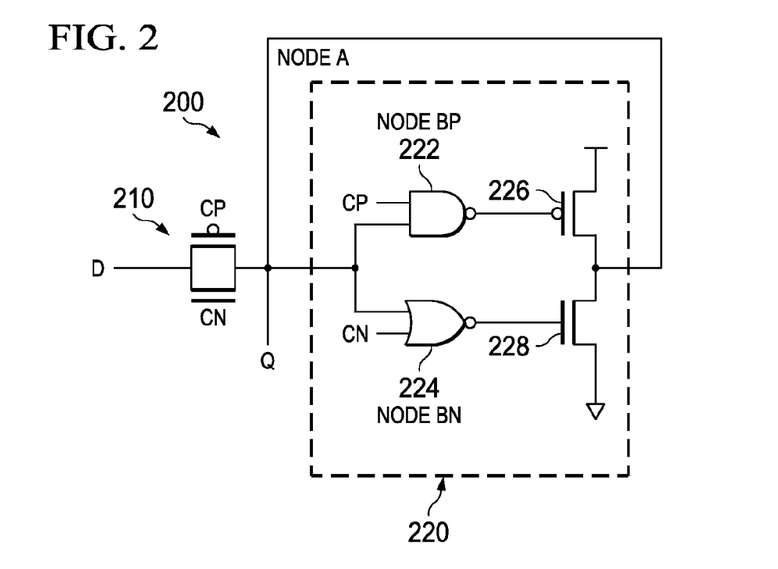
FIG. 2 is a device-level schematic diagram of one embodiment of a latch configured to reduce SERs and constructed according to the principles of the invention.

FIG. 2 is device-level schematic diagram of one embodiment of a latch 200 configured to reduce SERs constructed according to the principles of the invention. The latch 200 is a single-path latch that, while designed for SER reduction, may require more die space on an IC and operate at a slower speed than the latch 100. The latch 200 includes a passgate 210 and tristate circuitry 220.

For the purpose of describing FIGS. 2-6, references will be made to a positive supply voltage and a negative supply voltage. Although the invention is not limited to a particular type of transistor, the various transistors of FIGS. 2-6 are metal-oxide semiconductor field-effect transistors (MOSFETs). In MOSFETs, the nominal positive supply voltage is commonly referred to as Vdd, and the nominal negative supply voltage is commonly referred to as Vss.

The passgate 210 is coupled to a clock and is configured to alternately allow the latch 200 to be transparent or latched based on a negative clock pulse signal, CN, and a positive clock pulse signal CP. The passgate 210 may be configured as and operate as the passgate 110. The passgate 210 receives the data input D.

The tristate circuitry 220 is coupled to the passgate 210 in series and is configured to drive the feedback path of the latch 200. The tristate circuitry 220 includes a NAND gate 222, a NOR gate 224, a p-channel MOSFET (PMOS) transistor 226 and an n-channel MOSFET (NMOS) transistor 228. The NAND gate 222 includes a first input A, a second input B and an output C. The NOR gate 224 includes a first input E, a second input F and an output G. The first input A of the NAND gate 222 is coupled to the positive clock pulse signal CP of the clock. The second input F of the NOR gate 224 is coupled to the negative clock pulse signal CN of the clock. Both the second input B of the NAND gate 222 and the first input E of the NOR gate 224 are coupled to the passgate 210 and the feedback path. The output C of the NAND gate is coupled to the gate of the PMOS transistor 226 and the output G of the NOR gate 224 is coupled to the gate of the NMOS transistor 228.

The feedback transistors are a single transistor pair, the PMOS transistor 226 and the NMOS transistor 228. A fixed size transistor, therefore, may have twice the drive strength of feedback compared to the latch 100. Additionally, the latch 200 only has one transistor drain that exists for a target. Thus, when using a fixed size transistor latch 200 will also have one-half the area of latch 100. Both of these effects can cause a reduction in the SER.

Additionally, as illustrated in FIG. 2, the Node B of the latch 100 has been split into two parallel paths, Nodes BP and BN, in the latch 200. This increases the robustness of the latch 200 by reducing the probability of flipping (i.e, changing the logical value from a 1 (high) to a 0 (low) or vice-versa) the stored value of the latch 200 if the disturbed node is Node BP or BN. In other words, disturbing Nodes BP and BN will not necessarily disturb the stored value of the latch 200.

For example, when Node A is storing a logic value 1 (Vdd) and nodes BP and BN are storing logic value 0 (Vss), the PMOS transistor 226 is turned on and the NMOS transistor 228 is turned off. If Node BP is disturbed so that it briefly transitions to a 1 (Vdd) from a 0 (Vss), the PMOS transistor 226 briefly turns off while the NMOS transistor 228 is undisturbed and stays off. Therefore, Node A will maintain its stored value and not change. Node A may maintain its stored value due to the electrical charge stored on the internal parasitic capacitance.

If Node BN is disturbed so that it briefly transitions to a 1 (Vdd) from a 0 (Vss), the NMOS transistor 228 turns on and the PMOS transistor 226 stays on. The Node A will be disturbed, but because the NMOS transistor 228 and the PMOS transistor 226 are both on, they will not move Node A beyond some voltage level around the mid-point between Vss and Vdd. If the NAND gate 222 and the NOR gate 224 are designed properly, these gates will not flip at this mid-point value. Accordingly, the regenerative feedback will be stopped. An embodiment of the tristate circuitry 220 is presented in FIG. 2A and is discussed below.

When Node A is storing a logic value 0 (Vss) and nodes BP and BN are storing logic value 1 (Vdd), the NMOS transistor 228 is turned on and the PMOS transistor 226 is turned off. Additionally, if Node BP is disturbed so that it briefly transitions to a 0 (Vss) from a 1 (Vdd), then the PMOS transistor 226 turns on while the NMOS transistor 228 stays on. The Node A will be disturbed, but because the PMOS and NMOS transistors 226, 228, are both on, these transistors will not move Node A beyond some voltage level around the mid-point between Vdd and Vss. If the NAND and NOR gates 222, 224, are designed properly, they will not flip at this midpoint value, and the regenerative feedback will be stopped.

Furthermore, if Node BN is disturbed so that it briefly transitions to a 0 (Vss) from a 1(Vdd), the NMOS transistor 228 briefly turns off while the PMOS transistor 226 is undisturbed and stays off. Accordingly, Node A will maintain it's stored value for this brief transition and will not change.

The latch 200, therefore, provides improved stability against soft errors that may result due to SEUs at Nodes BP and BN. A disturbance at Node A, however, may still cause a soft error for the latch 200. Though the stronger feedback transistors, PMOS transistor 226 and NMOS transistor 228, will provide increased resistance to a disturbance compared to the latch 100, there will be some amount of injected charge which can flip the latch 200 by disturbing Node A. Immunity to SEUs, therefore, may be further improved if Node A can be similarly split into two paths as Node B.

Figure 2A:
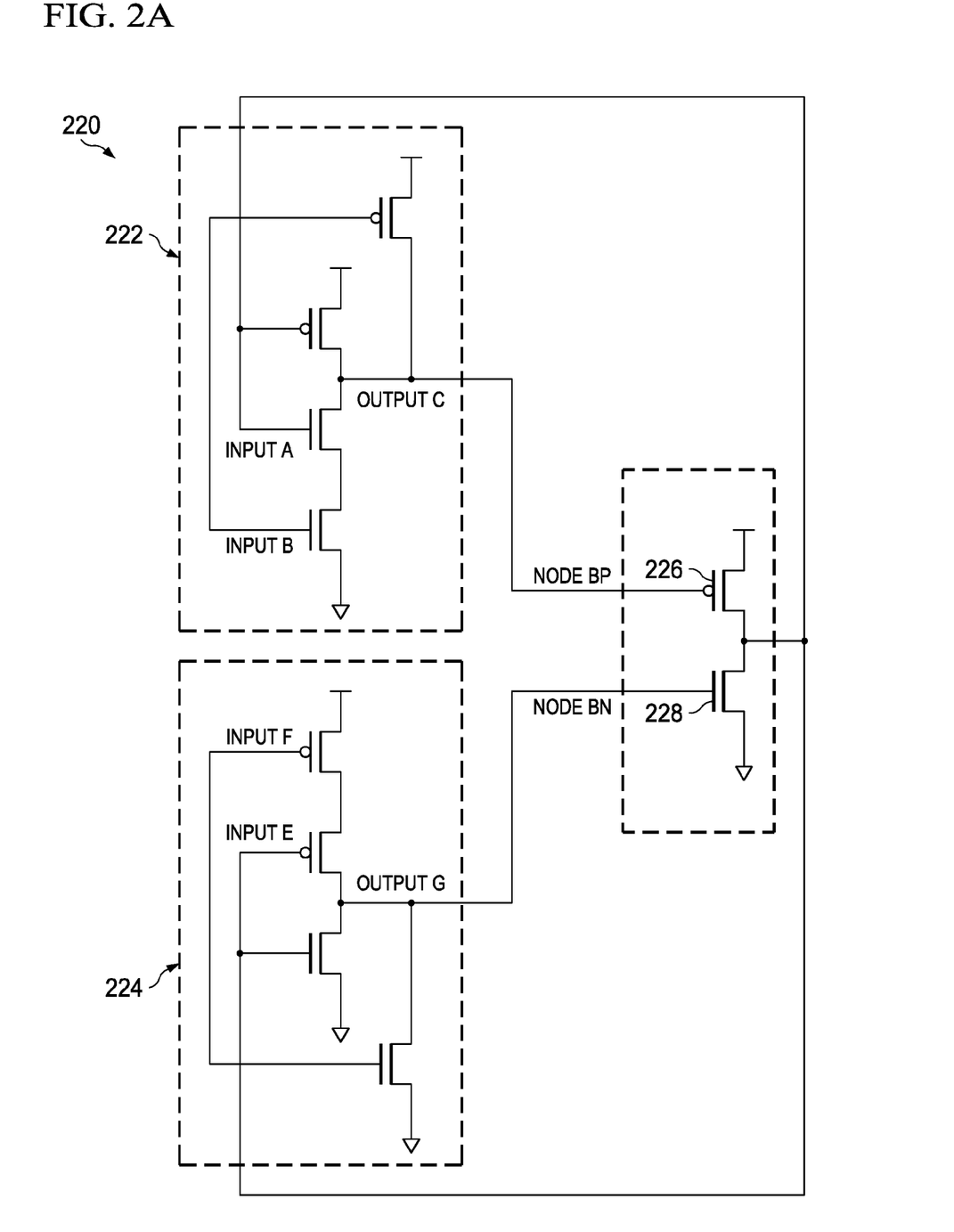
FIG. 2A is a transistor-level schematic diagram of one embodiment of the tristate circuitry in the latch of FIG. 2.

FIG. 2A is an embodiment of the tristate circuitry 220 with a transistor-level schematic of the NAND gate 222 and the NOR gate 224 designed to resist flipping at the mid-point value between Vss and Vdd. The input voltage level which causes the NAND gate 222 or the NOR gate 224 to switch is referred to as a "switch point." The switch point is controlled by the relative resistances of the transistors. Since the two NMOS transistors are in series with the output, each NMOS transistor should have ½ the resistance of each PMOS transistor for the switch point of the NAND gate 222 to be halfway between Vss and Vdd (a mid-point switching value).

Since the NAND gate 222 is not followed by a common CMOS inverting boolean gate, but rather by a single PMOS transistor, the switch-point of the NAND gate 222 may be moved toward one of the power supplies. For the latch 200, the transistor 226 can be made easier to turn off than turn on, so that the loop gain looks small for a disturbance on node BN. Similarly, the NOR gate 224 can be made such that the output connected to transistor 228 is easy to drive to a zero but difficult to drive to a one.

The NAND gate 222 can be made easier to drive to a one by making the PMOS transistors relatively stronger than the NMOS transistors of the NAND gate 222. Because the NMOS transistors of the NAND gate 222 are already in series, they are easy to make weak. This results in bringing the input switch point up towards Vdd.

Likewise, if the PMOS transistors of the NOR gate 224 are made to be relatively weak (versus the mid-point switching value where they would each have their on-resistance ½ of each NMOS transistor's on-resistance), then the input switch point of the NOR gate 224 will be pushed down towards Vss.

A 10% difference from the midpoint may be used. For example, if Vss=0V and Vdd=1.0V, then the switch point for the NOR gate 224 will be around 0.4V and the switch point for the NAND gate 222 will be around 0.6V. The best values to move the midpoint would be found by experimentation and simulations, and would involve performance trade-off's (the circuit can slow down as it is made harder to disturb).

Figure 3:
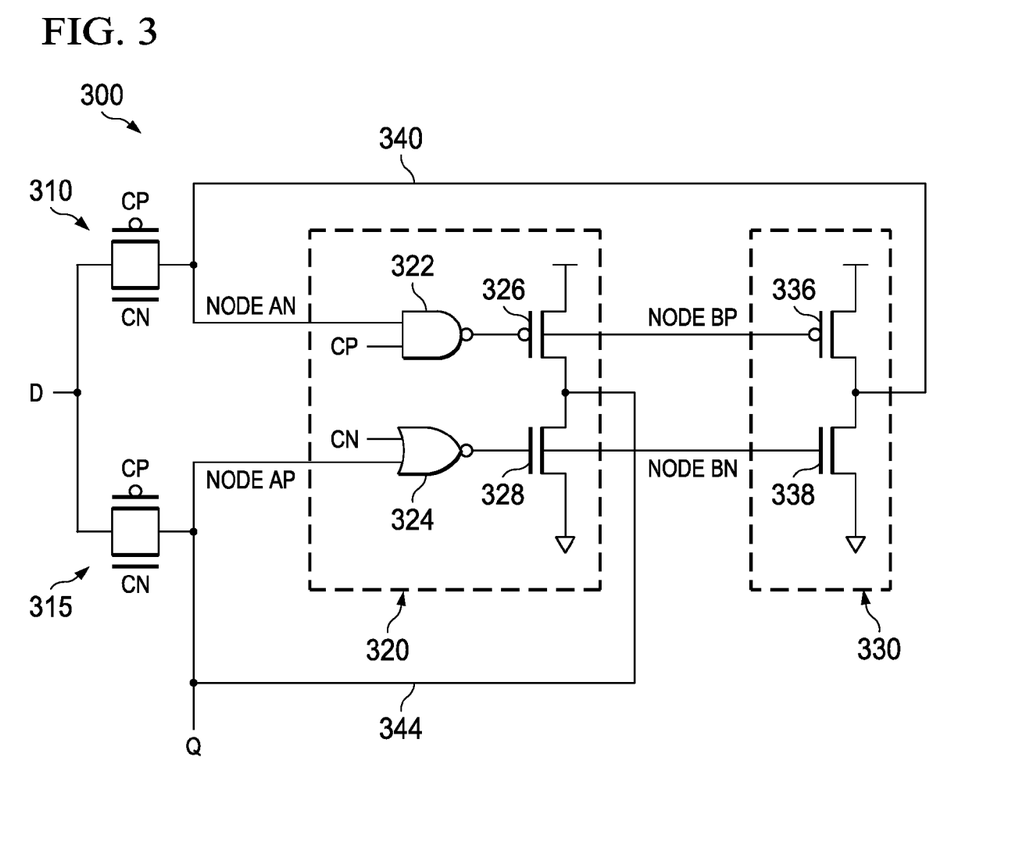
FIG. 3 is a device-level schematic diagram of another embodiment of a latch configured to reduce SERs and constructed according to the principles of the invention.

FIG. 3 is device-level schematic diagram of another embodiment of a latch 300 configured to reduce SERs and constructed according to the principles of the invention. The latch 300 is a dual-path latch having both Nodes A and B split into two nodes. Node A is split into Nodes AN and AP and Node B is split into Nodes BN and BP. The latch 300 includes a first passgate 310, a second passgate 315, tristate circuitry 320 and a feedback driver 330.

The passgates 310, 315, are coupled to a clock and are configured to alternately allow the latch 300 to be transparent or latched based on a negative clock pulse signal, CN, and a positive clock pulse signal CP. The passgates 310, 315, may be configured as and operate as the passgate 210. The passgates 310, 315, receive the data input D. Unlike the latch 200, the latch 300 includes two feedback paths, 340 and 344. The tristate circuitry 320 is configured to drive both of the feedback paths 340, 344, employing the feedback driver 330 for the feedback path 340.

The tristate circuitry 320 is coupled to the passgates 310, 315, and includes a NAND gate 322, a NOR gate 324, a PMOS transistor 326 and an NMOS transistor 328. The NAND gate 322 includes a first input A, a second input B and an output C. The NOR gate 324 includes a first input E, a second input F and an output G. The first input A of the NAND gate 322 is coupled to the positive clock pulse signal CP of the clock. The second input F of the NOR gate 324 is coupled to the negative clock pulse signal CN of the clock. The second input B of the NAND gate 322 is coupled to the first passgate 310 and the feedback path 340. The first input E of the NOR gate 324 is coupled to the passgate 315 and the feedback path 344. The output C of the NAND gate 322 is coupled to the gate of the PMOS transistor 326 and the output G of the NOR gate 324 is coupled to the gate of the NMOS transistor 328.

The tristate circuitry 320 is also coupled to the feedback driver 330. The feedback driver 330 includes a PMOS transistor 336 and an NMOS transistor 338. The output C of the NAND gate 322 is coupled to the gate of the PMOS transistor 336 and the output G of the NOR gate 324 is coupled to the gate of the NMOS transistor 338. The feedback driver 330 is configured to drive the feedback path 340 under the control of the tristate circuitry 320. The PMOS transistor 326 and the NMOS transistor 328 of the tristate circuitry 320 may be considered a driving stack for the feedback path 344.

The dual-path latch 300 provides a further-improved circuit having immunity against an SEU compared to the single-path latch 200. Improved immunity, however, is achieved at the expense of area (i.e., it has more transistors) and power (the extra transistors will require more power to switch values, and will provide more paths for the transistors to leak current dissipating static power). An example follows demonstrating the potential of the dual-path latch 300 to resist an SEU.

When Nodes AP and AN are storing a logic value 1 (Vdd) and nodes BP and BN are storing logic value 0 (Vss), a disturbance on Node AP or Node BN causes Node AN and Node AP to move down towards Vdd/2 but should not cross Vdd/2. A disturbance on Node AN or Node BP can briefly float the PMOS devices, PMOS transistors 326 and 336, but leave the stored values static. That is, the stored logic value of 1 on Nodes AP and AN and the stored logic value of 0 on Nodes BP and BN remain unchanged.

In one embodiment, the NOR gate 324 may have a low switching threshold to assist in restricting the feedback on the feedback paths 340, 344. In another embodiment, the feedback driver 330 may have a strong PMOS transistor 336 and a weaker NMOS transistor 338 to assist in keeping the Node AP at a high logic value. The low switching threshold for the NOR gate 324 can be obtained by reducing the width to length ratio of the PMOS transistors therein such that the output of the NOR gate 324 switches when the input values are in the range of, for example, 0.4*Vdd. The PMOS transistor 336 can be made stronger by increasing the width to length ratio thereof, and the NMOS transistor 338 can be made weaker by reducing the width to length ratio thereof.

When Nodes AP and AN are storing a logic value 0 (Vss) and nodes BP and BN are storing logic value 1 (Vdd), a disturbance on Node AP or Node BN may briefly float the NMOS devices, NMOS transistors 328 and 338, but leaves the stored values static. A disturbance on Node AN or Node BP causes Nodes AN and AP to move up towards Vdd/2, but should not cross Vdd/2. In one embodiment, the NAND gate 322 may have a high switching threshold to assist in restricting feedback along both feedback paths 340 and 344. In another embodiment, the feedback driver 330, that is the AN driving stack, may have weak PMOS transistor 336 and strong NMOS transistor 338, to keep Node AN low at logic value 0 (Vss). The high switching threshold for the NAND gate 322 can be obtained by reducing the width to length ratio of the NMOS transistors therein such that the output of the NAND gate 322 switches when the input values are in the range of, for example, 0.6*Vdd. The NMOS transistor 338 can be made stronger by increasing the width to length ratio thereof, and the PMOS transistor 336 can be made weaker by reducing its width to length ratio.

Figure 4:
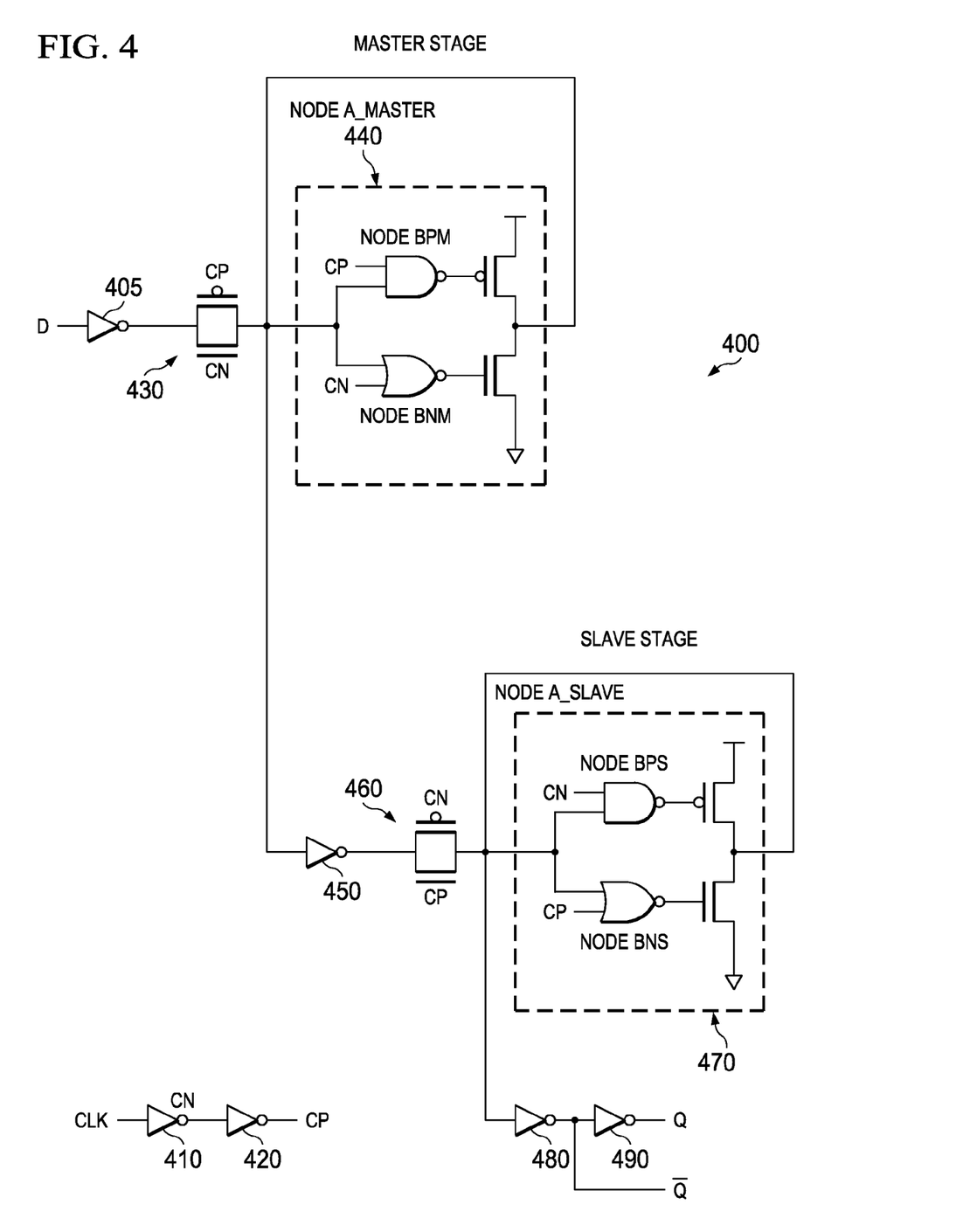
FIG. 4 is a device-level schematic diagram of one embodiment of a DFF configured to reduce SERs and constructed according to the principles of the invention.
Figure 5:
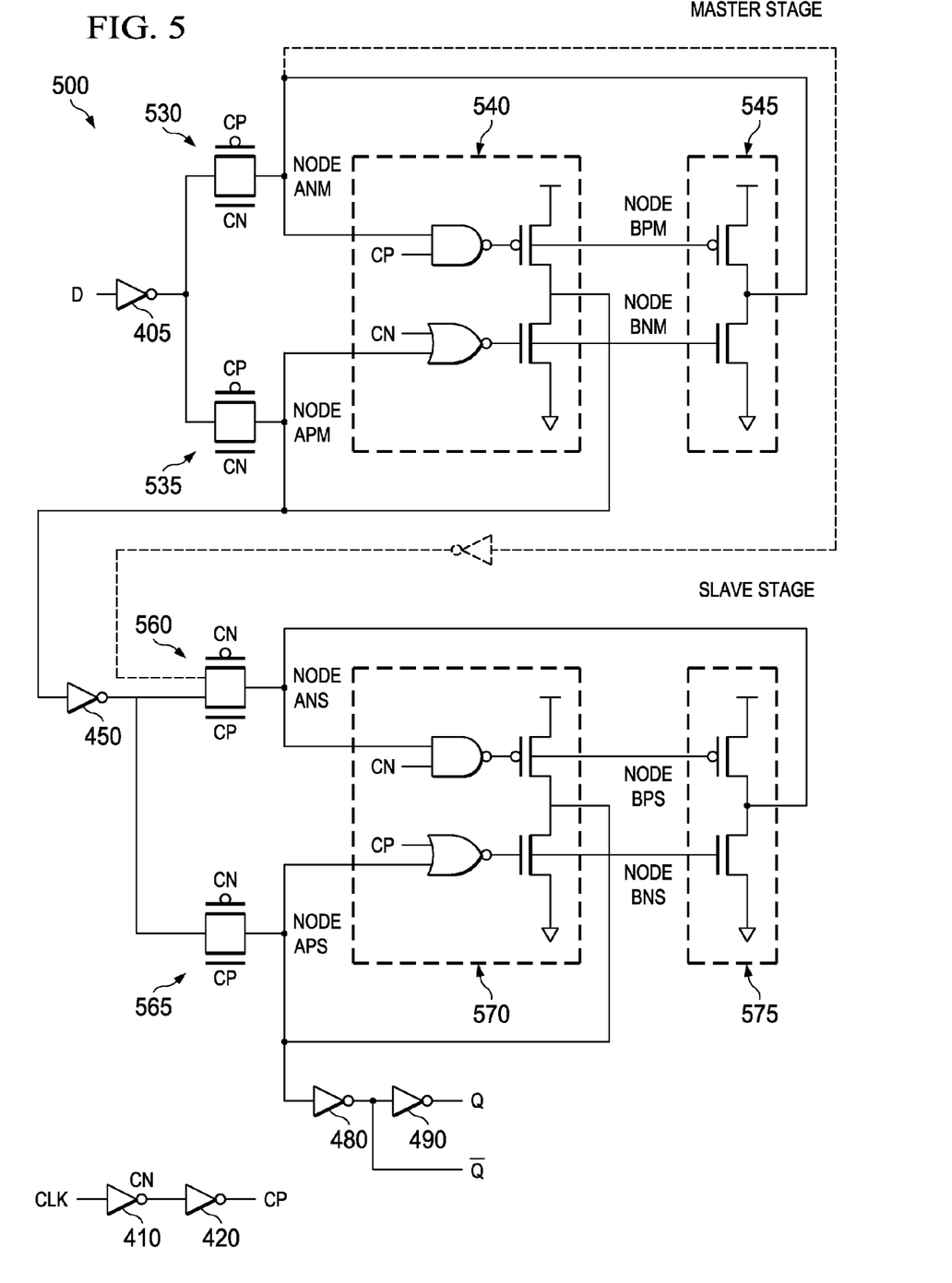
FIG. 5 is a device-level schematic diagram of another embodiment of a DFF configured to reduce SERs and constructed according to the principles of the invention.

The single-path latch of FIG. 2 and the dual-path latch of FIG. 3 can be used as level sensitive transmission gate latches. As noted above, two latches can be combined to make a DFF. As illustrated in FIG. 4, the two latches may be single-path latches. In FIG. 5, the two latches may be dual-path latches to provide greater immunity to SEUs and an improved SER in exchange for increased die area and increased power requirements. In some embodiments, a combination of a single-path latch and a dual-path latch may be used to form a DFF. In FIGS. 4 and 5, the single-path latches and the dual-path latches are configured as and operate as the disclosed single-path latch and dual-path latch of FIGS. 2-3.

Both of the DFFs in FIG. 4 and FIG. 5 may include a scan multiplexor on the input for additional testability. Each DFF may also include different connections to, for example, buffer the main output Q. Single-path DFF of FIG. 4 will typically require less die area (36 transistors) compared to the dual-path DFF of FIG. 5 (44 transistors). Both may perform similarly which will usually be slower (and more die space) than a basic DFF.

FIG. 4 is a device-level schematic diagram of one embodiment of a DFF 400 configured to reduce the SER and constructed according to the principles of the invention. The DFF 400 has a data input D received by an inverter 405, a clock input CLK, a data output Q and an inverted data output $\overline{Q}$. First and second series-coupled inverters 410, 420, are coupled to the clock input CLK and, respectively, provide a negative clock pulse signal, CN, and a positive clock pulse signal CP. A master stage passgate 430 is coupled to D. A latch, including the master stage passgate 430, forms a master stage of the DFF 400. The latch also includes tristate circuitry 440 to form the master stage of the DFF 400.

A slave stage passgate 460 is coupled to Node A of the master stage via an inverter 450. A second latch, including the slave stage passgate 460, forms a slave stage of the DFF 400. The second latch also includes tristate circuitry 470 to form the slave stage of the DFF 400.

Inverters 480, 490, are coupled to Node A of the slave stage and provide Q and $\overline{Q}$, respectively. In other embodiments, Q and $\overline{Q}$ may be derived from the slave stage via other means.

As FIG. 4 shows, CP and CN drive the master stage passgate 430, master stage tristate circuitry 440, slave stage passgate 460 and slave stage tristate circuitry 470 to convey a logic state (either a "zero" or a "one") that is initially present at D through the master stage, through the slave stage and out Q and $\overline{Q}$.

More specifically, the master stage and slave stage passgates 430, 460, each contain a PMOS transistor and an NMOS transistor. The master stage PMOS transistor and slave stage NMOS transistor receive CP, and the master stage NMOS transistor and slave stage PMOS transistor receive CN. When CP is low and CN is high, the master stage passgate 430 passes the logic state present at D to a NAND gate and a NOR gate of the tristate circuitry 440. This places the master stage in a transparent phase allowing the master stage passgate 430 to pass the logic state present at D to the Node A. When CP is high and CN is low, the slave stage passgate 460 passes, via the inverter 450, the logic state present at Node A of the master stage allowing the slave stage passgate 460 to pass the logic state present at Node A of the master stage to the tristate circuitry 470 of the slave stage.

When CP is high and CN is low, the master stage passgate 430 closes, and the tristate circuitry 440 places the master stage into a latched, or opaque, state in which the logic state provided to the tristate circuitry 440 is stored in the master stage. Likewise, when CP is low and CN is high, the slave stage passgate 460 closes and the slave stage is placed into a latched state in which the logic state provided to the tristate circuitry 470 is stored in the slave stage.

FIG. 5 is a device-level schematic diagram of another embodiment of a DFF 500 constructed according to the principles of the invention to reduce SERs. DFF 500 includes some comparable components that are also included in DFF 400. As such, these components, for example the inverter 405, have been denoted the same in FIG. 5. Additionally, operation of the clock between the positive clock signal, CP, and the negative clock signal, CN, will transition the master stage and slave stage through transparent and latched states to move the input data D to the outputs Q and $\overline{Q}$.

The DFF 500 has a data input D received by an inverter 405, a clock input CLK, a data output Q and an inverted data output $\overline{Q}$. First and second series-coupled inverters 410, 420, are coupled to the clock input CLK and, respectively, provide a negative clock pulse signal, CN, and a positive clock pulse signal, CP. Master stage passgates 530, 535, are coupled to D through the inverter 405. A dual-path latch, including the master stage passgates 530, 535, forms a master stage of the DFF 500. The dual-path latch also includes tristate circuitry 540 and a feedback driver 545 to form the master stage of the DFF 500.

Slave stage passgates 560, 565, are coupled to Node APM of the master stage via the inverter 450. In some embodiments, both Nodes APM and ANM may be used as inputs to the slave stage. For this embodiment, the node APM can drive through inverter 450 to the input side of the slave passgate 565 as shown in FIG. 5, while the slave passgate 560 would be disconnected from the output of inverter 450, and instead would be connected to node ANM through another inverter (represented by the dashed line and inverter in FIG. 5) so that the dual path nature of the design is maintained throughout (at the expense of increased silicon area and power). A second dual-path latch, including the slave stage passgates 560, 565, form a slave stage of the DFF 500. The second dual-path latch also includes tristate circuitry 570 and a feedback drive 575 to form the slave stage of the DFF 500.

Inverters 480, 490, are coupled to Node APS of the slave stage and provide $\overline{Q}$ and Q, respectively. In other embodiments, $\overline{Q}$ and Q may be derived from the slave stage via other means.

Figure 6:
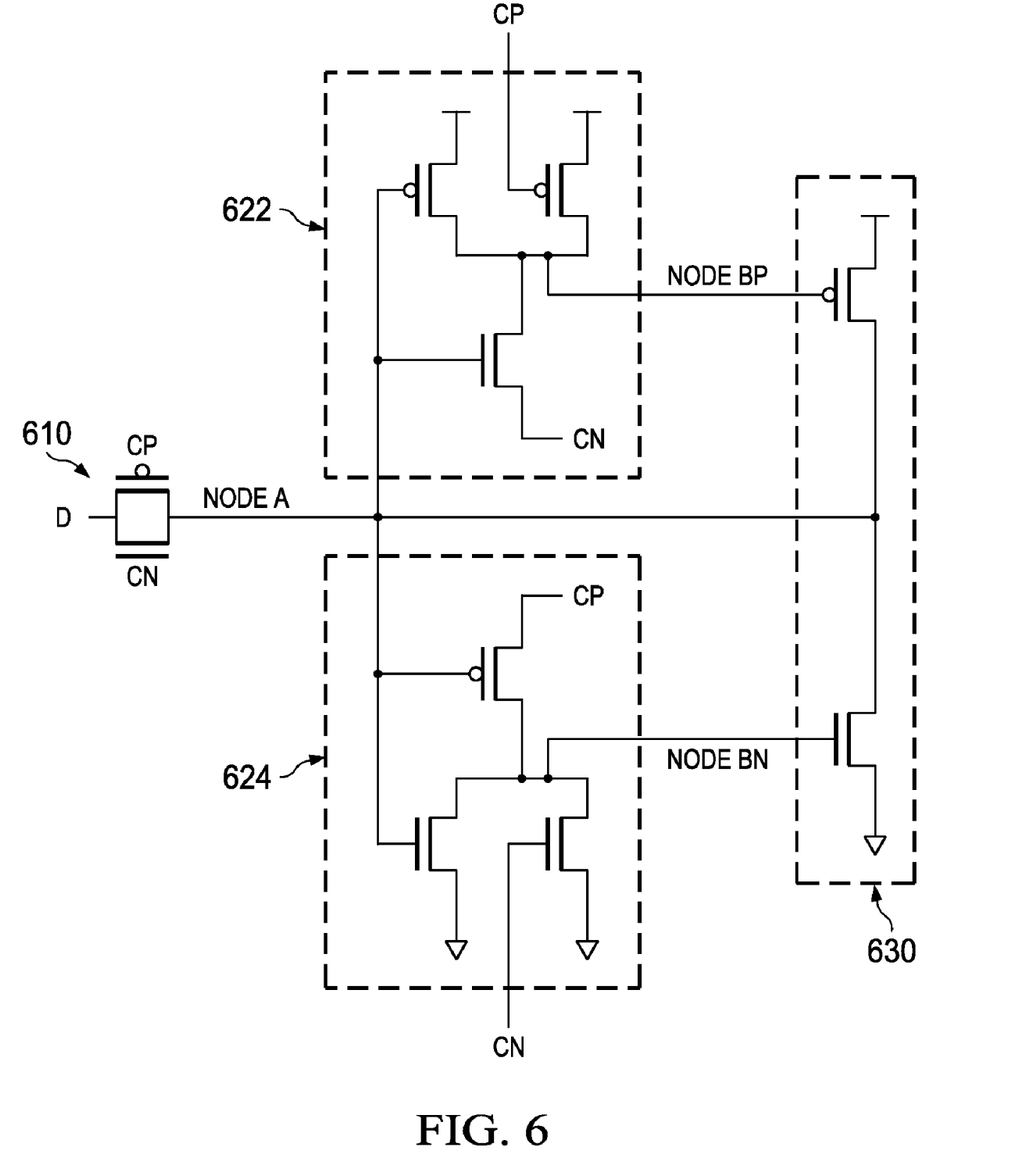
FIG. 6 is a device-level schematic diagram of yet another embodiment of a single-path latch constructed according to the principles of the invention.

FIG. 6 is a device-level schematic diagram of one embodiment of a latch 600 including a NAND and NOR gate constructed according to the principles of the invention. The latch 600 may be employed in DFFs including those disclosed herein. The latch 600 includes a passgate 610 that receives a data input D, a NAND gate 622, a NOR gate 624 and a feedback driver 630. The latch 600 also receives a positive clock signal CP and a negative clock signal CN.

The operation and configuration of the passgate 610 may be the same as the other passgates discussed herein. The passgate 610 is coupled to the NAND gate 622, the NOR gate 624 and the feedback driver 630. The feedback driver 630 includes a PMOS transistor coupled in a series stack with an NMOS transistor.

The NAND gate 622 includes two PMOS transistors and a single NMOS transistor. Each drain of the three transistors of the NAND gate 622 is coupled together. The gates of the first PMOS transistor and the NMOS transistor are coupled to the passgate 610. The gate of the second PMOS transistor is coupled to the positive clock signal CP. The source of the NMOS transistor is coupled to the negative clock signal CN. The NAND gate 622 is coupled to the gate of the PMOS transistor of the feedback driver 630 via the coupled drains of the NAND gate 622 transistors.

The NOR gate 624 includes two NMOS transistors and a single PMOS transistor. Each drain of the three transistors of the NOR gate 624 is coupled together. The gates of the first NMOS transistor and the PMOS transistor are coupled to the passgate 610. The gate of the second NMOS transistor is coupled to the negative clock signal CN. The source of the PMOS transistor is coupled to the positive clock signal CP. The NOR gate 624 is coupled to the gate of the NMOS transistor of the feedback driver 630 via the coupled drains of NOR gate 624 transistors.

The latch 600 is a single-path latch. However, the NAND and NOR gates disclosed in FIG. 6 may also be employed in a dual-path latch or in DFFs employing the single-path and dual-path latches. The latch 600 reduces the die area needed compared to the single-path latch of FIG. 2 while requiring approximately the same switching power. The latch 600 employs clock inputs that are already re-buffered producing a buffered and an inverted version of the clock, CP and CN. These buffered clock signals can be used as virtual grounds in the latch 600 to eliminate 2 transistors compared to the single-path latch in FIG. 6.

Figure 7:
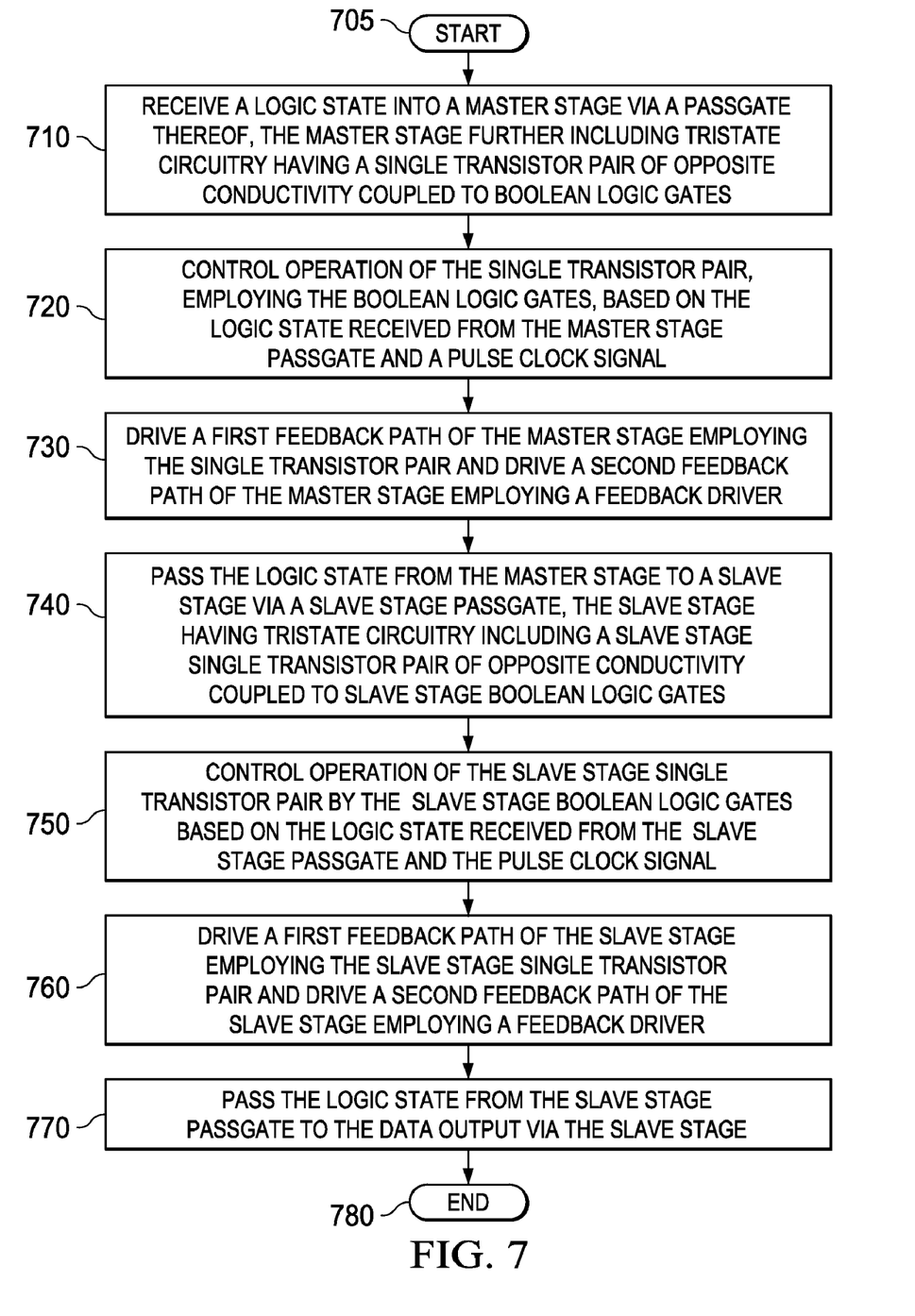
FIG. 7 is a flow diagram of one embodiment of a method of operating a DFF such that its vulnerability to SBUs is reduced.

FIG. 7 is a flow diagram of one embodiment of a method 700 of operating a DFF such that its vulnerability to SBUs is reduced. The DFF includes a master stage and a slave stage and uses a pulse clock signal to provide a data output from a received data input. The method 700 begins in a start step 705. In a step 710, a logic state (i.e., the data input) is received into the master stage via a passgate of the master stage. The master stage also includes tristate circuitry having a single transistor pair of opposite conductivity coupled to Boolean logic gates. Operation of the single transistor pair is controlled employing the Boolean logic gates in a step 720. The Boolean logic gates control the single transistor pair based on the logic state received from the master stage passgate and the pulse clock signal.

In a step 730, the single transistor pair is used to drive a first feedback path and a feedback driver of the master stage is used to drive a second feedback path. The logic state is passed from the master stage to the slave stage via a slave stage passgate in a step 740. The slave stage includes tristate circuitry having a slave stage single transistor pair of opposite conductivity coupled to slave stage Boolean logic gates. Operation of the slave stage single transistor pair is controlled by the slave stage Boolean logic gates in a step 750. The Boolean logic gates may control the single transistor pair based on the logic state received from the slave stage passgate and the pulse clock signal.

In a step 760, the single transistor pair of the slave stage is used to drive a first feedback path of the slave stage and a feedback driver of the slave stage is used to drive a second feedback path of the slave stage. The logic state from the slave stage passgate is passed to the data output via the slave stage in a step 770. The method 700 then ends in a step 780.

The specification discloses logic elements configured to reduce the affect of SEUs and improved the SER. By improving the SER at the logic element level, then the SER of an entire design can be improved without customer involvement. The various disclosed logic elements can be included in a library of cells allowing implementations of designs to provide improved immunity to SERs. The library may include cells corresponding to the improved NAND and NOR gates that employ fewer transistors compared to the conventional devices. Cells corresponding to single-path latches and dual-path latches may also be included. DFFs including the single-path latches or dual-path latches can be represented in the library, also. Additionally, the library may include cells corresponding to latches and DFFs that include the improved NAND or NOR gates. In addition to being used as part of a standard cell library, the disclosed circuits may be used as part of compiler generated designs or full-custom designs.

The disclosed circuits reflect CMOS design logic. Comparable designs may also be used in bipolar or other design logic. Additionally, the DFFs illustrated in the disclosure may be part of more complex logic, or may include other logic such as scan input multiplexors, Boolean functions, etc.

The disclosed circuits can: (1) reduce SER with minimum impact to area, performance and power; (2) be implemented in any manufacturing technology, and can be migrated into future technologies; and (3) be employed with conventional DFFs and latches to allow the IC designer a variety of performance, area, power and SER options for optimization of a design. Datapath portions of an IC which needs to operate at high speed while tolerating occasional errors can use conventional DFFs, whereas more sensitive portions of the IC which are intolerant to errors can use the disclosed designs. The use of the disclosed circuits in devices can be based on target market and quality requirements.

Those skilled in the art to which this application relates will appreciate that other and further additions, deletions, substitutions and modifications may be made to the described embodiments.

What is claimed is:

1. A latch having a data input and a data output, comprising:
    a passgate coupled to said data input;
    a feedback path coupled to said passgate, said data output coupled thereto; and tristate circuitry coupled to said passgate and having a single transistor pair of opposite conductivity coupled to Boolean logic gates comprising a single NAND gate including only three transistors and a single NOR gate including only three transistors, said Boolean logic gates configured to control operation of said single transistor pair based on said data input and a pulse clock signal to drive said feedback path.

2. The latch as recited in claim 1 wherein a first input of said NAND gate is coupled to a positive clock pulse signal of said pulse clock signal and a first input of said NOR gate is coupled to a negative clock pulse signal of said pulse clock signal.

3. The latch as recited in claim 2 wherein said single transistor pair includes a PMOS transistor and an NMOS transistor, said PMOS transistor coupled to and controlled by said NAND gate and said NMOS transistor coupled to and controlled by said NOR gate.

4. The latch as recited in claim 3 further comprising another passgate, a feedback driver and another feedback path coupled between said feedback driver and said another passgate.

5. The latch as recited in claim 4 wherein said feedback driver is coupled to said tristate circuitry and configured to drive said another feedback path.

6. A method of operating a D flip-flop having a data input and a data output, comprising:
receiving a logic state into a master stage via a passgate thereof, said master stage further including master stage tristate circuitry having a single transistor pair of opposite conductivity coupled to master stage Boolean logic gates;
passing said logic state from said master stage to a slave stage via a slave stage passgate coupled to said master stage; and
passing said logic state from said slave stage passgate to said data output via said slave stage having tristate circuitry, said slave stage tristate circuitry having a slave stage single transistor pair of opposite conductivity coupled to slave stage Boolean logic gates, wherein at least one of said master stage Boolean logic gates and said slave stage Boolean logic gates are comprised of a single NAND gate including only three transistors and a single NOR gate including only three transistors.

7. The method as recited in claim 6 further comprising:
controlling operation of said master stage single transistor pair by said master stage Boolean logic gates based on said logic state received from said master stage passgate and a pulse clock signal.

8. The method as recited in claim 7 further comprising driving a first feedback path of said master stage coupled between said master stage single transistor pair and said master stage passgate employing said master stage single transistor pair.

9. The method as recited in claim 8 further comprising:
controlling operation of said slave stage single transistor pair by said slave stage Boolean logic gates based on said logic state received from said slave stage passgate and said pulse clock signal.

10. The method as recited in claim 9 further comprising driving a first feedback path of said slave stage coupled between said slave stage single transistor pair and said slave stage passgate employing said slave stage single transistor pair.

11. The method as recited in claim 10 wherein said master stage and slave stage both further include another passgate, a feedback driver and another feedback path coupled between said feedback driver and said another passgate.

12. The method as recited in claim 11 further comprising driving said another feedback path in said master stage and said slave stage employing each of said respective feedback drivers.

13. A D flip-flop having a data input and a data output and comprising:
a master stage having a master stage passgate coupled to said data input and a slave stage having a slave stage passgate coupled to said master stage, wherein both of said master stage and said slave stage include:
a feedback path; and
tristate circuitry coupled to said feedback path and having a single transistor pair of opposite conductivity coupled to Boolean logic gates comprising a single NAND gate including only three transistors and a single NOR gate including only three transistors, said Boolean logic gates configured to control operation of said single transistor pair based on said data input and a pulse clock signal to drive said feedback path.

14. The D flip-flop as recited in claim 13 wherein a first input of said NAND gate is coupled to a positive clock pulse signal of said pulse clock signal and a first input of said NOR gate is coupled to a negative clock pulse signal of said pulse clock signal.

15. The D flip-flop as recited in claim 14 wherein said single transistor pair includes a PMOS transistor and an NMOS transistor, said PMOS transistor coupled to and controlled by said NAND gate and said NMOS transistor coupled to and controlled by said NOR gate.

16. The D flip-flop as recited in claim 15 further comprising another passgate, a feedback driver and another feedback path coupled between said feedback driver and said another passgate.

17. The D flip-flop as recited in claim 16 said feedback driver is coupled to said tristate circuitry and configured to drive said another feedback path.

18. A library of logic elements, comprising:
a standard logic element corresponding to a single-path latch having:
a passgate configured to receive a data input;
a feedback path coupled to said passgate and an output of said single-path latch; and
tristate circuitry coupled to said passgate and having a single transistor pair of opposite conductivity coupled to Boolean logic gates comprising a single NAND gate including only three transistors and a single NOR gate including only three transistors, said Boolean logic gates configured to control operation of said single transistor pair based on said data input and a pulse clock signal to drive said feedback path.

19. The library as recited in claim 18 further comprising a standard logic element corresponding to a dual-path latch having:
two passgates configured to receive a data input;
two different feedback paths coupled to said passgates;
tristate circuitry coupled to said passgates and having a single transistor pair of opposite conductivity coupled to Boolean logic gates comprising a single NAND gate including only three transistors and a single NOR gate including only three transistors, said Boolean logic gates configured to control operation of said single transistor pair based on said data input and a pulse clock signal to drive at least one of said two feedback paths; and a feedback driver coupled to said tristate circuitry and configured to drive only one of said two feedback paths.

20. The library as recited in claim 19 further comprising a standard logic element corresponding to a D flip-flop having one of said dual-path latch as a master stage and having another one of said dual-path latch as a slave stage.

21. The library as recited in claim 18 further comprising a standard logic element corresponding to a D flip-flop having one of said single-path latch as a master stage and having another one of said single-path latch as a slave stage.

22. The library as recited in claim 18 further comprising a standard logic element corresponding to a NAND gate having only three transistors and a standard logic element corresponding to a NOR gate having only three transistors.

23. The library as recited in claim 22 further comprising a standard logic element corresponding to circuitry including said NAND gate or said NOR gate.

* * * * *